US006239982B1

United States Patent
Bozzer et al.

(10) Patent No.: US 6,239,982 B1
(45) Date of Patent: May 29, 2001

(54) ELECTRONIC DEVICE HAVING A SINGLE-SIDED CIRCUIT BOARD

(75) Inventors: Erich Bozzer, Dearborn Heights; Harold Ryan Macks, Redford; Jarek Tracz, Farmington Hills; Roman Jaroslaw Los, Hamtramck, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/338,658

(22) Filed: Jun. 23, 1999

(51) Int. Cl.[7] .......................................... H05K 1/18
(52) U.S. Cl. ................ 361/760; 361/736; 361/752; 361/818; 361/748; 174/52.2; 174/260; 174/261; 123/480; 123/643
(58) Field of Search .................... 361/760, 736, 361/752, 818, 777, 748, 728, 684, 816; 174/52.2, 260, 261; 228/180.21, 180.22; 257/695, 691; 180/65.3, 65.8, 60; 123/480, 643, 146, 674

(56) References Cited

U.S. PATENT DOCUMENTS

| | | | |
|---|---|---|---|
| 4,557,225 | * 12/1985 | Sagues et al. | 123/41.31 |
| 4,758,459 | * 7/1988 | Mehta | 428/131 |
| 5,077,451 | 12/1991 | Mohsen | 174/261 |
| 5,166,865 | * 11/1992 | Morrison et al. | 361/760 |
| 5,250,844 | 10/1993 | Smith | 257/695 |
| 5,581,130 | * 12/1996 | Boucheron | 307/10.1 |
| 5,699,230 | * 12/1997 | Ota | 361/736 |
| 5,751,557 | * 5/1998 | Silva | 361/777 |
| 5,764,489 | 6/1998 | Leigh et al. | 361/777 |
| 5,801,440 | 9/1998 | Chu et al. | 257/691 |
| 5,873,751 | 2/1999 | Daly et al. | |
| 5,920,463 | * 7/1999 | Thomas et al. | 361/760 |

FOREIGN PATENT DOCUMENTS 1575634  9/1977 (GB).
95/26064 A1  9/1995 (WO).

OTHER PUBLICATIONS

WPI Abstract Accession No. 199–266661 [23] & JP 10321979 A (Hewlett Packard) Apr. 12, 1998, and PAJ Abstract JP10321979 A.

* cited by examiner

Primary Examiner—Jeffrey Gaffin
Assistant Examiner—David Foster
(74) Attorney, Agent, or Firm—Rhonda L. McCoy-Pfau

(57) ABSTRACT

In one embodiment of the present invention, an electronic device comprises a circuit board having a first side and a second side and having circuit traces formed only on the first side. The electronic device further includes a voltage regulator providing a regulated voltage via a regulated voltage output terminal and having a regulated voltage return terminal. Additionally, the electronic device includes a microcontroller mounted to the first side of the circuit board and having a plurality of regulated voltage input terminals and corresponding microcontroller voltage return terminals. The electronic device also comprises a bus comprising a first circuit trace coupled to the regulated voltage output terminal and a second circuit trace coupled to the regulated voltage return terminal, the first circuit trace and the second circuit trace running substantially parallel to one another. Furthermore, the electronic device include a plurality of supply conductors, each coupled to the first circuit trace and to one of the regulated voltage input terminals; and a plurality of return conductors, each coupled to the second circuit trace and to one of the microcontroller voltage return terminals. Designs according to the present invention can provide excellent radiated emissions performance with an economical single-sided circuit board and a minimal number of T-filters.

14 Claims, 2 Drawing Sheets

ELECTRONIC DEVICE HAVING A SINGLE-SIDED CIRCUIT BOARD

BACKGROUND OF THE INVENTION

1. Field of the Invention

The present invention relates to electronic devices and more specifically to electronic devices containing a single-sided circuit board.

2. Description of the Related Art

In designs for electronic devices for motor vehicles, functionality is of course very important. However, electromagnetic compatibility with the various electronic systems on the vehicle is also of great importance. One aspect of electromagnetic compatibility is assuring that all devices on the vehicle are within acceptable limits for radiated emissions.

Electronic devices having printed circuit boards conventionally have "double sided" circuit boards. That is, the circuit board of such devices has circuit traces on both sides. This provides a significant electromagnetic-compatibility benefit in that the routing of signals among components on the circuit board can be kept as short as possible. This is true because a circuit trace on the board can run partially on one side of the board, and then be routed through a hole and continue its run on the other side of the board, to provide substantial flexibility to minimize the length of the run. Also, having a double-sided board allows for generous provision of ground traces on both sides of the board, to allow ready access to a ground trace for return of signal current. In allowing signal routing and return to be kept as physically short and routed as closely together as possible, a double-sided circuit board minimizes the opportunity for the signals to radiate to the environment away from the circuit board.

As attractive as a double-sided circuit board may be, however, it has a very substantial disadvantage: cost. In an electronic device such as an instrument cluster for a motor vehicle, a double-sided circuit board may be the most expensive component, in the instrument cluster (even when taking into account a microprocessor, which is becoming a frequent inclusion in instrument clusters).

One particular type of instrument cluster coming into more frequent use is a cluster which has stepper motor gauges. Such gauges, as their name implies, use a stepper motor to position the gauge pointers of the instrument cluster. Such clusters almost invariably include a microcontroller. Microcontrollers having integrated capability to drive a plurality of stepper motor gauges are available.

A microprocessor, which typically operates at clock frequencies of several megahertz, poses a significant radiated emissions challenge. In a microcontroller having integrated stepper motor gauge drive capability, regulated supply voltage is supplied to several terminals and used for several purposes. For example, a regulated five-volt supply input (and a corresponding regulated five-volt return) is provided to power the "core" of the microcontroller. The "core" is the typical digital microprocessor section of the microcontroller. Regulated five-volt supply inputs (and a corresponding regulated five-volt return for each) are typically also provided to power the stepper motor control outputs of the microcontroller, general purpose inputs and outputs of the microcontroller and analog power for the microcontroller.

The current drawn and returned by the microcontroller to and from the voltage regulator on the circuit board can provide a significant radiated emissions challenge. A known design to minimize radiated emissions includes using a two-sided circuit board. A five-volt regulator on the circuit board is coupled to a single node from which several five-volt supply traces are "starred" to the various microcontroller inputs requiring five-volt regulated power. This single node is coupled by a capacitor to ground. In the star configuration, the various supply traces to the microcontroller inputs, being run separately from the single node to the microcontroller, help to prevent electromagnetic noise coupling among them. The return paths from the microcontroller use the generous grounding structure available with a two-sided circuit board. This provides a short run for the signal returns, in order to further help reduce radiated emissions. However, such designs known to the inventor still have T-filters incorporated on the circuit board across each regulated voltage input/return pair in order to assure reasonable radiated emission performance.

Using a single-sided circuit board and minimizing the number of filters required would greatly reduce the cost of a stepper motor instrument cluster. However, a challenge in the use of a single-sided board for this purpose is that a single-point "star" configuration as discussed above cannot readily be used; a single-sided board simply does not provide enough circuit-trace-routing flexibility to allow a star configuration. Further, the ability to provide generous grounds on two sides of the board is inherently eliminated when a single-sided board is used.

A design for a microcontroller-based electronic device which can use a single-sided circuit board and still provide excellent radiated emissions performance with the inclusion of only a minimal number of "T" filters will provide significant advantages over the prior art. Such a design will provide very substantial cost advantage over alternative designs.

SUMMARY OF THE INVENTION

The present invention provides an electronic device comprising a circuit board having a first side and a second side and having circuit traces formed only on the first side. The electronic device further includes a voltage regulator providing a regulated voltage via a regulated voltage output terminal and having a regulated voltage return terminal. Additionally, the electronic device includes a microcontroller mounted to the first side of the circuit board and having a plurality of regulated voltage input terminals and corresponding microcontroller voltage return terminals. The electronic device also comprises a bus comprising a first circuit trace coupled to the regulated voltage output terminal and a second circuit trace coupled to the regulated voltage return terminal, the first circuit trace and the second circuit trace running substantially parallel to one another. Furthermore, the electronic device include a plurality of supply conductors, each coupled to the first circuit trace and to one of the regulated voltage input terminals; and a plurality of return conductors, each coupled to the second circuit trace and to one of the microcontroller voltage return terminals.

By allowing the use of a single-sided circuit board and a minimal number of filters in electronic applications such as stepper motor instrument clusters, the present invention provides substantial cost advantages over the prior art.

DETAILED DESCRIPTION OF THE PREFERRED EMBODIMENT

Figure 1:
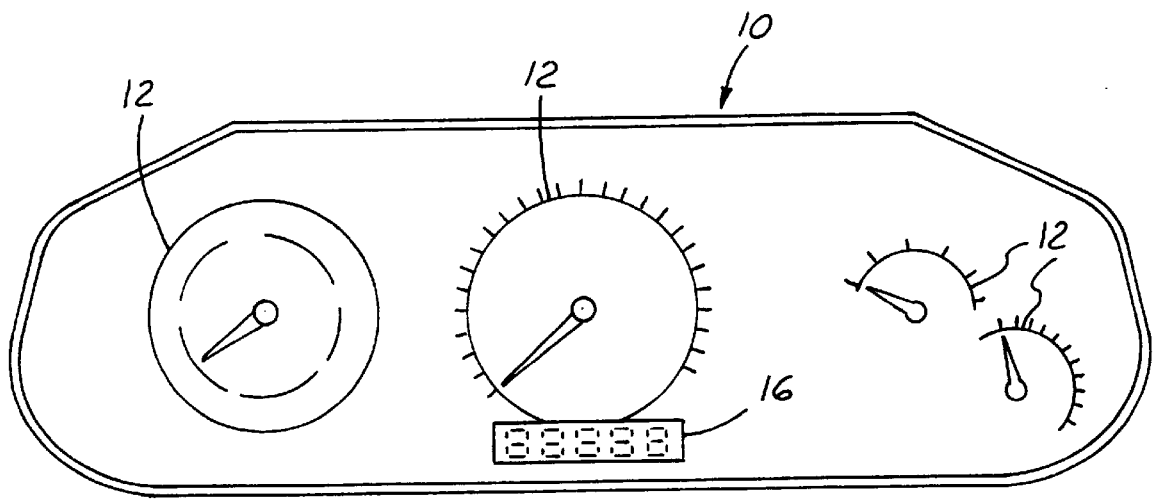
FIG. 1 is a front view of an instrument cluster for a motor vehicle.

Refer first to FIG. 1. There is illustrated an instrument cluster 10 for a motor vehicle. Instrument cluster 10 includes several gauges 12. Gauges 12 are preferably stepper motor gauges. Instrument cluster 10 also includes a liquid crystal display 16.

Figure 2:
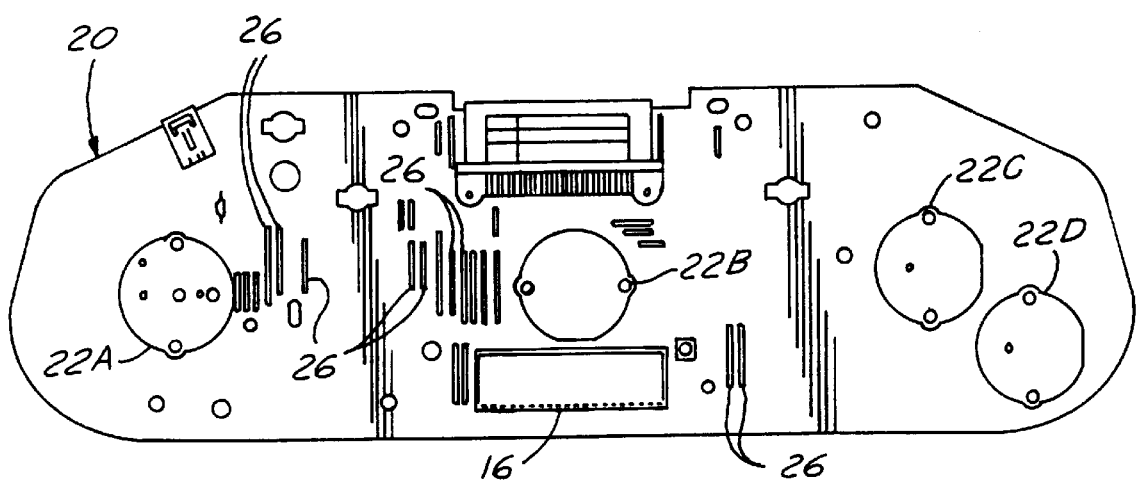
FIG. 2 is a front view of the circuit board from the instrument cluster of FIG. 1.

Refer additionally to FIG. 2. Illustrated there is the circuit board 20 of instrument cluster 10. Circuit board 20 has mounted thereon four stepper motors 22A, 22B, 22C and 22D to drive the pointers of gauges 12.

Circuit board 20 is preferably a single-sided circuit board. That is, circuit board 20 has circuit traces formed on one side of the board. (For the purposes of this discussion, "circuit traces" are those conductors formed integrally with the circuit board, as opposed to wires or other conductors attached to the circuit board.) The side of circuit board 20 viewed in FIG. 2 is the side of the board with no circuit traces formed thereon. The various components visible in FIG. 2 (such as stepper motors 22A, 22B, 22C and 22D, liquid crystal display 16 and various light-emitting diodes) all have leads running through holes in circuit board 20 and soldered to the other side of the board. Circuit board 20 also has numerous "staples" 26, many of them generically marked with reference number 26. These "staples" are wire conductors located on the side of circuit board visible in FIG. 2, but having both ends running through holes and soldered to circuit traces on the other side of circuit board 20. Staples 26 allow added flexibility in routing some signals of circuit board 20, because circuit board 20 is only a single-sided board.

Figure 3:
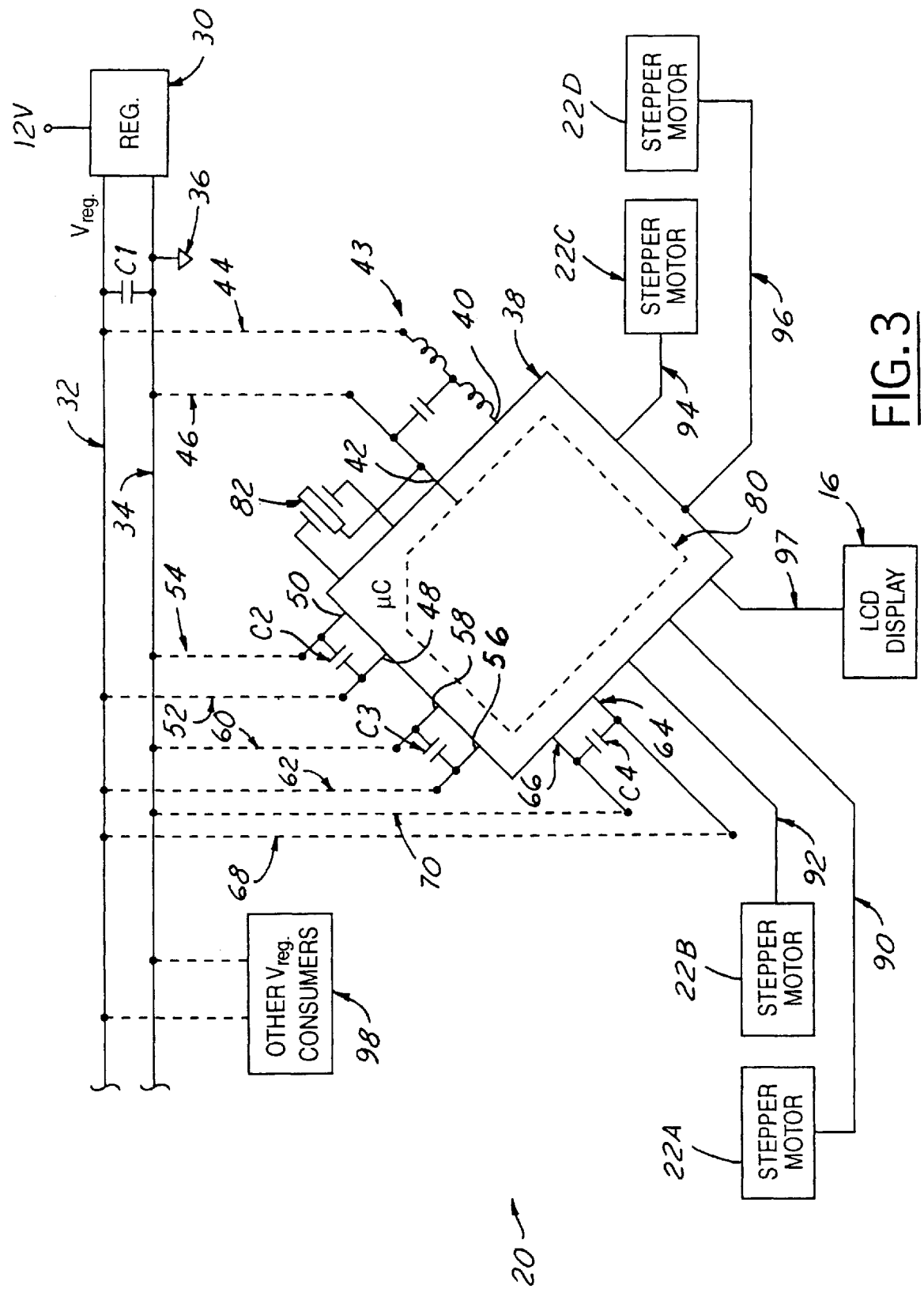
FIG. 3 is a block diagram showing the signal routing for the circuit board of FIG. 2.

Refer now additionally to FIG. 3. FIG. 3 is a block diagram schematically showing a view of circuit board 20 from the other side of the board (that is, the side of the board having circuit traces formed thereon). Illustrated in FIG. 3 is a voltage regulator 30. Voltage regulator 30 may be a single integrated circuit mounted to circuit board 20 or may be a combination of several electronic components designed to provide a regulated output voltage. Voltage regulator 30 takes an unregulated input voltage (such as the nominal 12-volt voltage available in the motor vehicle) and provides a regulated voltage $V_{reg}$, typically five volts.

Regulated voltage $V_{reg}$ is provided to a first circuit trace 32 on circuit board 20. The return to regulator 30 is coupled to a second circuit trace 34. First circuit trace 32 and second circuit trace 34 are preferably located parallel to one another and as close to one another as possible and without any circuit traces therebetween (to form a "bus"), in order to minimize the loop area for any currents traveling on traces 32 and 34. Preferably circuit traces 32 and 34 are less than two millimeters apart, and more preferably approximately one millimeter apart. The return to regulator 30 is also coupled to ground 36 of circuit board 20. A capacitor C1 is provided at regulator 30 between traces 32 and 34.

Circuit traces 32 and 34 are also coupled to several terminals of microcontroller 38. Microcontroller 38 is preferably a device having a microprocessor with integrated capability to directly drive stepper motors. One such microcontroller 38 is the 780973A MCU available from NEC Corporation.

Terminal 40 is the power input for the "core" of microcontroller 38. The core is the digital microprocessor section of microcontroller 38. Terminal 42 is the return corresponding to terminal 40. Terminals 40 and 42 are coupled to circuit traces 32 and 34, respectively, via a T-filter 43, to prevent emissions from the core of microcontroller 38 from being propagated to other sections of circuit board 20. T-filter 43 is selected to have significant attenuation at frequencies greater than the fundamental internal clock speed of microcontroller 38 (typically 8 MHz). Therefore the current demanded at the fundamental internal clock speed of microcontroller 38 is permitted to pass through T-filter 43. However, higher frequency current components that are harmonics of the internal clock speed of microcontroller 38 are not permitted to pass through T-filter 43. Coupling of terminals 40 and 42 to circuit traces 32 and 34 is via staples 44 and 46. Staples 44 and 46 are themselves preferably parallel to one another and as close together as practical. Staples 44 and 46 are shown as dashed lines to indicate that they are routed on the side of circuit board 20 opposite that as viewed in FIG. 3. Solid lines in FIG. 3 reflect circuit traces formed on circuit board 20.

Terminal 48 of microcontroller 38 is the analog power input to microcontroller 38, and terminal 50 is the return corresponding to terminal 48. The analog power provides the voltage reference for an analog-to-digital converter within microcontroller 38. Terminals 48 and 50 are coupled to circuit traces 32 and 34 via staples 52 and 54. A capacitor C2 is provided between terminals 48 and 50.

Terminal 56 of microcontroller 38 is the peripheral power input to microcontroller 38, and terminal 58 is the return corresponding to terminal 56. "Peripheral power" is the power for the general purpose inputs and outputs of microcontroller 38. Terminals 56 and 58 are coupled to circuit traces 32 and 34 via staples 60 and 62. A capacitor C3 is provided between terminals 56 and 58.

Terminal 64 of microcontroller 38 is the stepper motor power input to microcontroller 38, and terminal 66 is the return corresponding to terminal 64. Terminal 64 provides power for "H"-bridge motor drivers within microcontroller 38. Terminals 64 and 66 are coupled to circuit traces 32 and 34 via staples 68 and 70. A capacitor C4 is provided between terminals 64 and 66.

In the design as heretofore described, the 5v bus, the non-core power pins of microcontroller 38 tied to this bus, and the loads that are powered from these non-core power pins are isolated from the 5v core noise by T-filter 43. This prevents the 5v bus and the associated loads that are tied to this 5v bus from serving as an antenna to broadcast these higher frequency harmonics present on the terminals 40 and 42. The 5v bus system and the associated staples that route power to the various power pins on microcontroller 38 also isolate these pins from one another and help minimize the current loop back to the 5v regulator to minimize radiated emissions (RE) on the various power pins.

A large ground plane 80 is provided beneath microcontroller 38 on circuit board 20 in order to capture digital emissions from the core of microcontroller 38. This ground plane 80 is coupled via a circuit trace to terminal 42 of microcontroller 38 and is otherwise isolated from the other return terminals (50, 58 and 66) of microcontroller 38. Ground plane 80 is finally joined in electrical communication with those other return terminals only near regulator 30, via staple 46. Isolating ground plane 80 from the other returns substantially prevents digital emissions from the core of microcontroller 38 from propagating throughout circuit board 20 via coupling with returns 50, 58 and 66.

Also coupled to microcontroller 38 is a crystal oscillator 82, which provides the clock signal for operation of microcontroller 38. The ground connection of crystal oscillator 82 is coupled, along with terminal 42, for return to conductor 34 via staple 46. Thus, any emissions from crystal oscillator 82 will be isolated from returns 50, 58 and 66.

Traces 90, 92, 94 and 96 generically show the connections of microcontroller 38 to stepper motors 22A, 22B, 22C and 22D. In reality, each of traces 90, 92, 94 and 96 will be more than one conductor; the precise details of the connections to the stepper motors is known to those skilled in the art and are not germane to the present invention.

LCD display 16 is also coupled to be driven by microcontroller 38. Again, only one circuit trace 97 is shown for this purpose; in reality, several circuit traces will connect microcontroller 38 with LCD display 16.

Other consumers 98 of regulated voltage Vreg can also be coupled to the bus comprising circuit traces 32 and 34.

It has been demonstrated that a circuit board design as described herein provides excellent radiated emissions performance. The design does so with the use of an economical single-sided circuit board and with only one T-filter coupled to microcontroller 38. The design overcomes the single-sided board's limitation which makes difficult the use of a "star" configuration for distribution of the five-volt regulated voltage.

Various other modifications and variations will no doubt occur to those skilled in the arts to which this invention pertains. Such variations which generally rely on the teachings through which this disclosure has advanced the art are properly considered within the scope of this invention. This disclosure should thus be considered illustrative, not limiting; the scope of the invention is instead defined by the following claims.

What is claimed is:

1. An electronic device comprising:
   a circuit board having a first side and a second side and having circuit traces formed only on said first side and having at least one stepper motor mounted to said circuit board;
   a voltage regulator providing a regulated voltage via a regulated voltage output terminal and having a regulated voltage return terminal;
   a microcontroller mounted to said first side and having a plurality of regulated voltage input terminals and corresponding microcontroller voltage return terminals and said microcontroller further includes an integrated stepper motor drive capability and is coupled to control said at least one stepper motor;
   a bus comprising a first circuit trace coupled to said regulated voltage output terminal and a second circuit trace coupled to said regulated voltage return terminal, said first circuit trace and said second circuit trace running substantially parallel to one another; and
   a plurality of supply conductors, each coupled to said first circuit trace and to one of said regulated voltage input terminals;
   a plurality of return conductors, each coupled to said second circuit trace and to one of said microcontroller voltage return terminals.

2. An electronic device as recited in claim 1, further comprising at least one gauge pointer, each gauge pointer coupled to be driven by a said stepper motor.

3. An electronic device as recited in claim 1, wherein:
   said supply conductors are wires routed on said second side of said circuit board and coupled to said first circuit trace through holes in said circuit board; and
   said return conductors are wires routed on said second side of said circuit board and coupled to said second circuit trace through holes in said circuit board.

4. An electronic device as recited in claim 1, wherein:
   said microcontroller a said regulated voltage input terminal and a corresponding microcontroller voltage return terminal dedicated to a microprocessor core section of said microcontroller; and
   said electronic device further comprises a filter coupled across said regulated voltage input terminal dedicated to said core section and that voltage input terminal's corresponding microcontroller voltage return terminal.

5. An electronic device as recited in claim 4, wherein said filter is a T-filter.

6. An electronic device as recited in claim 5, wherein said T-filter is the only T-filter coupled across any of said regulated voltage input terminals and corresponding microcontroller voltage return terminals.

7. An electronic device as recited in claim 1, wherein said microcontroller voltage return terminal corresponding to said regulated voltage input terminal dedicated to said core section is returned to said second circuit trace closer to said voltage regulator than the remaining said microprocessor voltage return terminals.

8. An electronic device as recited in claim 7, wherein said microcontroller voltage return terminal corresponding to said regulated voltage input terminal dedicated to said core section is electrically coupled to a ground plane formed on said first side of said circuit board.

9. An electronic device as recited in claim 8, wherein said ground plane is located substantially beneath said microcontroller.

10. An electronic device as recited in claim 9, wherein:
    said electronic device further comprises an oscillator coupled to said microcontroller; and
    said oscillator includes a ground terminal coupled to said second circuit trace via a common return conductor as a microprocessor voltage return terminal corresponding to a regulated voltage input terminal dedicated to said core section.

11. An electronic device as recited in claim 10, wherein said oscillator is a crystal oscillator.

12. An electronic device as recited in claim 1, wherein said first circuit trace and said second circuit trace are adjacent to one another, with no circuit traces disposed therebetween.

13. An electronic device as recited in claim 12, wherein said first trace and said second trace are spaced less than two millimeters apart.

14. An electronic device as recited in claim 13, wherein said first trace and said second trace are spaced approximately one millimeter apart.

* * * * *